United States Patent
Suh et al.

[11] Patent Number: 5,851,843
[45] Date of Patent: Dec. 22, 1998

[54] METHOD OF MANUFACTURING A SUPER CONDUCTION FIELD EFFECT TRANSISTOR

[75] Inventors: Jeong Dae Suh; Gun Yong Sung, both of Daejon, Rep. of Korea

[73] Assignee: Electronics and Telecommunications Research Institute, Daejon, Rep. of Korea

[21] Appl. No.: 951,503

[22] Filed: Oct. 16, 1997

[30] Foreign Application Priority Data

Nov. 4, 1996 [KP] DPR of Korea ............ 96-51780

[51] Int. Cl.⁶ .................................. H01L 21/00
[52] U.S. Cl. .............................. 438/2; 505/330
[58] Field of Search ................ 438/2; 505/330, 505/701

[56] References Cited

U.S. PATENT DOCUMENTS 5,274,249  12/1993  Xi et al. .
5,466,664  11/1995  Inada et al. ............... 505/330
5,696,392  12/1997  Char et al. ................ 257/190

*Primary Examiner*—Jey Tsai
*Attorney, Agent, or Firm*—Jacobson, Price, Holman & Stern, PLLC

[57] ABSTRACT

A method of manufacturing super conduction field effect transistor having a bi-crystal boundary junction is disclosed. According to the present invention, it is constituted such that on a $SrTiO_3$ bi-crystal substrate, a bi-crystal super conductive thin films for source and drain electrode having a compound of $YBa_2Cu_3O_{7-x}$, a non-super conductive oxide layer having a compound of $PrBa_2Cu_3O_{7-x}$ interposed between the bi-crystal super conductive thin films for source and drain electrode and the $SrTiO_3$ bi-crystal substrate, a boundary channel interposed therebetween, a amorphous insulating layer for gate electrode having a compound of $SrTiO_3$ deposited on a portion between the bi-crystal super conductive thin films for source and drain electrode above the boundary channel, metal pads for electrode, respectively, formed on the bi-crystal super conductive thin films for source and drain electrode and the amorphous insulating layer for gate electrode are sequentially formed.

27 Claims, 2 Drawing Sheets

METHOD OF MANUFACTURING A SUPER CONDUCTION FIELD EFFECT TRANSISTOR

BACKGROUND OF THE INVENTION

1. Field of the Invention

The present invention relates to a method of manufacturing a super conduction field effect transistor utilizing a bi-crystal super conductive thin film deposited on a bi-crystal substrate.

2. Description of the Related Art

In general, In order to embody an electronic device such as a field effect transistor utilizing a super conductive thin film which is composed of oxide, it is necessary to constitute a multilayered structure formed by sequentially depositing at least one of super conductive thin films and one of insulating layers on a substrate.

References have been made to various type of the field effect transistor structures, among which researches to the super conduction field effect transistor utilizing an boundary junction of a bi-crystal super conductive thin film which is composed of oxide, as a channel, which is deposited on a bi-crystal substrate has been widely made.

The two types of the bi-crystal boundary junction field effect transistor according to the prior art have been proposed as follows:

1) the one is the field effect transistor in which the boundary channel of the bi-crystal conductive thin film in a thickness of several tens nanometer which is directly deposited on the bi-crystal substrate is exposed to the atmosphere.

2) the other one is the field effect transistor in which the boundary channel of the bi-crystal conductive thin film which is directly deposited on the bi-crystal substrate is covered with a crystal insulating layer in a thickness of several hundreds nanometer.

However, these structures mentioned above have a disadvantage that in the structure of the field effect transistor in which the boundary channel is exposed to the atmosphere, a super conduction transition temperature thereof will lower below 50 K°, since either the thickness of the super conductive thin film is too thin to be applied as it is in the thickness of several tens nanometer, and thus, the quality of thin film easily deteriorates during the process of depositing the metal electrode thereon, or the quality of the thin film easily deteriorates, since the elastic stress occurs in the super conductive thin film due to the difference in the lattice constants between the substrate and the super conductive thin film.

Further, in the structure of the field effect transistor in which the boundary channel of the bi-crystal conductive thin film which is directly deposited on the bi-crystal substrate is covered with a crystal insulating layer in a thickness of several hundreds nanometer, the super conduction transition temperature thereof will lower below 50 K°, since the quality of the super conductive thin film easily deteriorates and therefore, the elastic stress occurs in the super conductive thin film due to the difference in the lattice constants between the super conductive thin film and the insulating layer. Thus, the severe problems encountered with these conventional bi-crystal boundary junction field effect transistor lies in that the operational temperature thereof can not exceed above 50 K° any further.

Therefore, it is an object of the present invention to overcome the above disadvantages and provide a method of manufacturing super conduction field effect transistor having a bi-crystal boundary junction, which is capable of possibly operating the field effect transistor at a temperature of above 50 K° by utilizing an amorphous insulating layer for gate electrode and a non-super conductive thin film for protection in order to avoid the elastic stress occurring in the super conductive thin film.

SUMMARY OF THE INVENTION

A field effect transistor for a bi-crystal boundary junction of the present invention is defined by the claims with a specific embodiment shown in the attached drawings. For the purpose of summarizing the present invention, the field effect transistor having a bi-crystal boundary junction according to the first embodiment of the present invention, a method for manufacturing a field effect transistor having a bi-crystal boundary junction comprises the steps of preparing a bi-crystal substrate, forming a super conductive thin films for source and drain electrode on the bi-crystal substrate by depositing a super conductive thin film thereon, forming a boundary channel interposed between the bi-crystal super conductive thin films for source and drain electrode and extended into the bi-crystal substrate, forming an amorphous insulating layer for gate electrode on a portion between the bi-crystal super conductive thin films for source and drain electrode above the boundary channel by depositing an amorphous insulating layer on the entire surface of the resulting structure and performing a mask patterning process thereof, and forming metal pads for electrode on the bi-crystal super conductive thin films for source and drain electrode and the amorphous insulating layer for gate electrode by depositing a metal layer on the entire surface of the resulting structure and performing a mask patterning process thereof.

In accordance with the second embodiment of the present invention, a method for manufacturing a field effect transistor having a bi-crystal boundary junction comprises the steps of preparing a bi-crystal substrate, depositing a non-super conductive oxide layer on the bi-crystal substrate, forming a super conductive thin layers for source and drain electrode on the non-super conductive oxide layer by depositing a super conductive thin film thereon, forming a boundary channel interposed between the bi-crystal super conductive thin films for source and drain electrode and extended into the non-super conductive oxide layer and the bi-crystal substrate, forming an amorphous insulating layer for gate electrode on a portion between the bi-crystal super conductive thin films for source and drain electrode above the boundary channel by depositing an amorphous insulating layer on the entire surface of the resulting structure and performing a mask patterning process thereof, and forming metal pads for electrode on the bi-crystal super conductive thin films for source and drain electrode and the amorphous insulating layer for gate electrode by depositing a metal layer on the entire surface of the resulting structure and performing a mask patterning process thereof.

As explained above, according to the super conduction field effect transistor having a bi-crystal boundary junction of the present invention, the resulting field effect transistor can be operated at a temperature of above 77 K° by depositing a $SrTiO_3$ amorphous insulating layer for gate electrode at which the lattice constants does not exist and a $PrBa_2Cu_3O_{7-x}$ non-super conductive thin film for protection the lattice constants of which substantially coincides with that of a $YBa_2Cu_3O_{7-x}$ non-super conductive thin film, such that the elastic stress in $YBa_2Cu_3O_{7-x}$ super conductive source and drain electrodes does not occur.

BRIEF DESCRIPTION OF THE DRAWINGS

For fuller understanding of the nature and objects of the invention, reference should be made to the following detailed description taken in conjunction with the accompanying drawings in which.

In the description to follow, references will be made to the accompanying drawings, where like reference numerals are used to identify like or similar elements in the various drawings.

Similar reference characters refer to similar parts in the several views of the drawings.

DETAILED DESCRIPTION OF THE INVENTION

Figure 1:
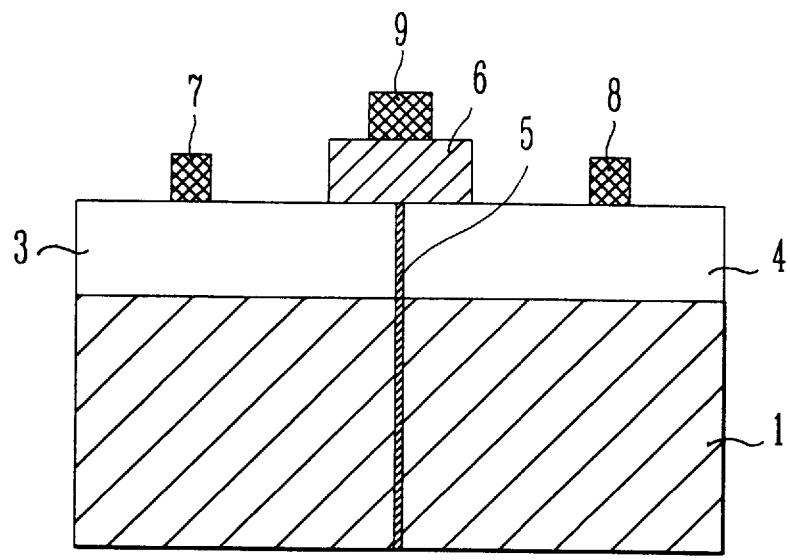
FIG. 1 is a sectional view illustrating a super conduction field effect transistor having a bi-crystal boundary junction in accordance with the first embodiment of the present invention.

Referring now to FIG. 1, it is a sectional view illustrating a super conduction field effect transistor having a bi-crystal boundary junction in accordance with the first embodiment of the present invention.

In the drawing, bi-crystal super conductive thin films for source and drain electrode 3 and 4 are formed on a bi-crystal substrate 1 by depositing a super conductive thin film thereon. A boundary channel 5 is interposed between the bi-crystal super conductive thin films for source and drain electrode 3 and 4 and is extended into the bi-crystal substrate 1. An amorphous insulating layer for gate electrode 6 is then formed on a portion between the bi-crystal super conductive thin films for source and drain electrode 3 and 4 above the boundary channel 5 by depositing an amorphous insulating layer on the entire surface of the structure and performing a mask patterning process thereof, which is well known in the art. On the bi-crystal super conductive thin films for source and drain electrode 3 and 4 and the amorphous insulating layer for gate electrode 6, metal pads for electrode 7, 8 and 9 are then formed, respectively, by depositing a metal layer, such as Au, on the entire surface of the structure and performing a mask patterning process thereof, which is also well known in the art. In the structure above, the compound of the amorphous insulating layer for gate electrode 6 is $SrTiO_3$. Further, the temperature of the bi-crystal substrate 1 is maintained at a temperature between 25° C. and 100° C. during the process of depositing the amorphous insulating layer for gate electrode 6. Here, when the amorphous insulating layer for gate electrode 6 is deposited on the super conductive thin film, it acts to prevent the elastic stress due to the different in the lattice constants therebetween from occurring in the super conductive thin film.

Figure 2:
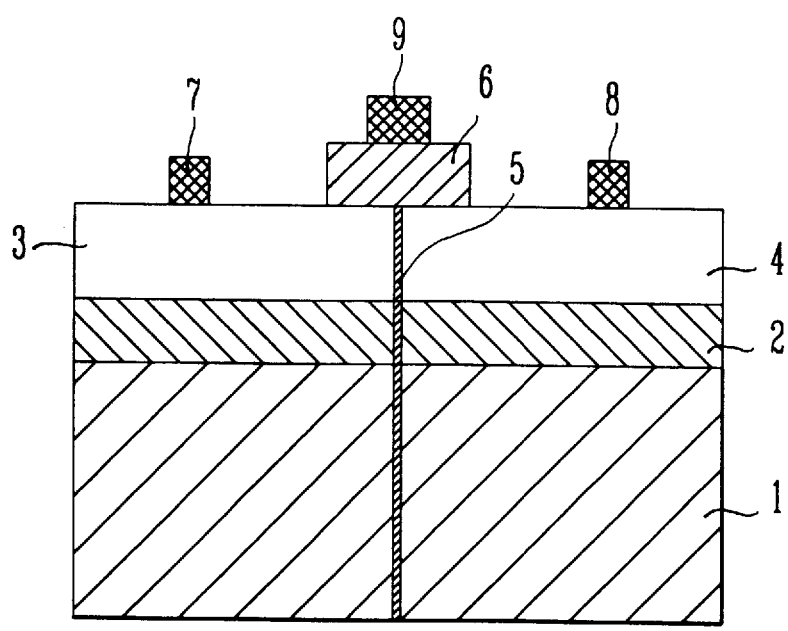
FIG. 2 is a sectional view showing a super conduction field effect transistor having a bi-crystal boundary junction in accordance with the second embodiment of the present invention.

In FIG. 2, a sectional view representing an another super conduction field effect transistor having a bi-crystal boundary junction in accordance with the second embodiment of the present invention is shown.

Referring to the drawing, it shows a structure that as compared to the structure of the super conduction field effect transistor having a bi-crystal boundary junction shown in FIG. 1, a non-super conductive oxide layer 2 is interposed between the bi-crystal super conductive thin films for source and drain electrode 3 and 4 and the bi-crystal substrate 1. In the structure, a non-super conductive oxide layer 2 having a compound of $PrBa_2Cu_3O_{7-x}$ is positioned between the super conductive thin film and the bi-crystal substrate 1. Further, the temperature of the bi-crystal substrate 1 is maintained at a temperature between 800° C. and 850° C. during the process of depositing the non-conductive oxide film 2. The insertion of the non-super conductive oxide film 2 results in preventing the elastic stress from occurring in the super conductive thin film, due to the different in the lattice constants between the super conductive thin film and the bi-crystal substrate.

Now, a method for manufacturing the super conduction field effect transistor having a bi-crystal boundary junction according to the first embodiment of the present invention will be described hereinafter.

The bi-crystal boundary junction field effect transistor having a gate electrode formed by an amorphous insulating layer 6 shown in FIG. 1 is constituted by providing the $SrTiO_3$ bi-crystal substrate 1 in <100> crystal plane, which has a boundary angle of 24° or 36.8°, the bi-crystal super conductive thin films for source and drain electrode 3 and 4 having a compound of $YBa_2Cu_3O_{7-x}$, the boundary channel 5 interposed therebetween, the $SrTiO_3$ amorphous insulating layer for gate electrode 6 deposited on a portion between the bi-crystal super conductive thin films for source and drain electrode 3 and 4 above the boundary channel 5, metal pads for electrode 7, 8 and 9, respectively, formed on the bi-crystal super conductive thin films for source and drain electrode 3 and 4 and the amorphous insulating layer for gate electrode 6. Here, the compound of the metal pads is Au. The field effect transistor as above is manufactured by the following process. It is noted that the deposition of all the layers is performed by utilizing the conventional pulse laser deposition method.

Example 1

The bi-crystal $YBa_2Cu_3O_{7-x}$ super conductive thin films for source and drain electrode 3 and 4 and the boundary channel 5 interposed therebetween are formed on the $SrTio_3$ bi-crystal substrate 1 in <100> crystal plane, which has a boundary angle of 24° or 36.8° by utilizing the conventional pulse laser deposition method.

| Detailed conditions of the deposition | |
|---|---|
| Substrate temperature | 810° C. |
| Oxygen pressure in deposition | In the presence of 100 mTorr |
| Thickness of super conductive thin film | 10 nm to 100 nm |

Example 2

The amorphous insulating layer for gate electrode 6 having a compound of $SrTiO_3$ is deposited on a portion between the bi-crystal $YBa_2Cu_3O_{7-x}$ super conductive thin films for source and drain electrode 3 and 4 above the boundary channel 5 by lowering the temperature of the $SrTiO_3$ bi-crystal substrate 1 down to the room temperature utilizing the conventional pulse laser deposition method.

| Detailed conditions of the deposition | |
| --- | --- |
| Substrate temperature | 25° C. |
| Oxygen pressure in deposition | In the presence of 100 mTorr |
| Thickness of insulating layer | 100 nm |

Example 3

The Au metal pads for electrode 7, 8 and 9 are formed on the bi-crystal $YBa_2Cu_3O_{7-x}$ super conductive thin films for source and drain electrode 3 and 4 and the amorphous insulating film for gate electrode 6, respectively, to make contacts therebetween by utilizing the conventional pulse laser deposition method.

| Detailed conditions of the deposition | |
| --- | --- |
| Substrate temperature | 25° C. |
| Oxygen pressure in deposition | In the presence of $10^{-4}$ mTorr |
| Thickness of metal pads | 100 nm to 300 nm |

Figure 3:
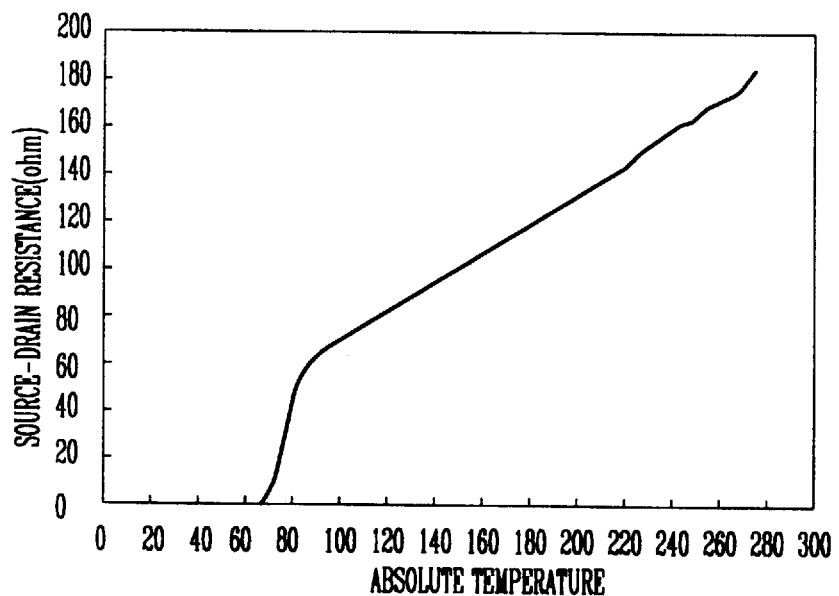
FIG. 3 is a graph representing the relationship of a resistance value and an absolute temperature between a thin film for source electrode and a thin film for drain electrode shown in FIG. 1.

In FIG. 3, it represents a graph representing the relationship of a resistance value and an absolute temperature between a thin layer for source electrode and a thin layer for drain electrode shown in FIG. 1.

The field effect transistor having a bi-crystal boundary junction shown in FIG. 2 has a different structure as compared to the structure in FIG. 1, in which it is constituted by forming the $SrTiO_3$ bi-crystal substrate 1 in <100> crystal plane, which has a boundary angle of 24° or 36.8°, the bi-crystal super conductive thin films for source and drain electrode 3 and 4 having a compound of $YBa_2Cu_3O_{7-x}$, the non-super conductive oxide layer 2 having a compound of $PrBa_2Cu_3O_{7-x}$ interposed between the bi-crystal super conductive thin films for source and drain electrode 3 and 4 and the $SrTiO_3$ bi-crystal substrate 1, the boundary channel 5 interposed therebetween, the amorphous insulating layer for gate electrode 6 having a compound of $SrTiO_3$ deposited on a portion between the bi-crystal super conductive thin films for source and drain electrode 3 and 4 above the boundary channel 5, metal pads for electrode 7, 8 and 9, respectively, formed on the bi-crystal super conductive thin films for source and drain electrode 3 and 4 and the amorphous insulating layer for gate electrode 6. Here, the compound of the metal pads is Au. The field effect transistor as above is manufactured by the following process. It is also noted that the deposition of all the layers is performed by utilizing the conventional pulse laser deposition method.

Example 1

The non-super conductive oxide layer 2 having a compound of $PrBa_2Cu_3O_{7-x}$ is formed on the $SrTiO_3$ bi-crystal substrate 1 in <100> crystal plane, which has a boundary angle of 24° or 36.8° by utilizing the conventional pulse laser deposition method.

| Detailed conditions of the deposition | |
| --- | --- |
| Substrate temperature | 850° C. |
| Oxygen pressure in deposition | In the presence of 100 mTorr |
| Thickness of non-super Conductive layer | 30 nm to 50 nm |

Example 2

The bi-crystal $YBa_2Cu_3O_{7-x}$ super conductive thin film is formed on the non-super conductive oxide layer 2 having a compound of $PrBa_2Cu_3O_{7-x}$ by utilizing the same method as above.

| Detailed conditions of the deposition | |
| --- | --- |
| Substrate temperature | 810° C. |
| Oxygen pressure in deposition | In the presence of 100 mTorr |
| Thickness of super conductive thin film | 10 nm to 100 nm |

Example 3

The amorphous insulating layer for gate electrode 6 having a compound of $SrTiO_3$ is deposited on a portion between the bi-crystal $YBa_2Cu_3O_{7-x}$ super conductive thin films for source and drain electrode 3 and 4 above the boundary channel 5 by lowering the temperature of the $SrTiO_3$ bi-crystal substrate 1 down to the room temperature utilizing the conventional pulse laser deposition method.

| Detailed conditions of the deposition | |
| --- | --- |
| Substrate temperature | 25° C. |
| Oxygen pressure in deposition | In the presence of 100 mTorr |
| Thickness of insulating layer | 100 nm |

Example 4

The Au metal pads for electrode 7, 8 and 9 are formed on the bi-crystal $YBa_2Cu_3O_{7-x}$ super conductive thin films for source and drain electrode 3 and 4 and the amorphous insulating layer for gate electrode 6, respectively, to make contacts therebetween by utilizing the conventional pulse laser deposition method.

| Detailed conditions of the deposition | |
| --- | --- |
| Substrate temperature | 25° C. |
| Oxygen pressure in deposition | In the presence of $10^{-4}$ mTorr |
| Thickness of metal pads | 100 nm to 300 nm |

Figure 4:
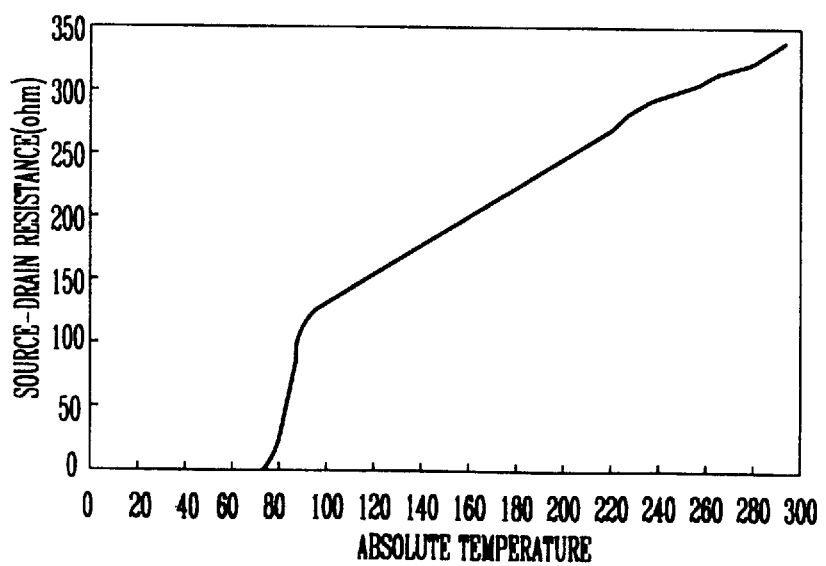
FIG. 4 is a graph illustrating the relationship of a resistance value and an absolute temperature between a thin film for source electrode and a thin film for drain electrode shown in FIG. 2.

FIG. 4 show a graph illustrating the relationship of a resistance value and an absolute temperature between a thin film for source electrode and a thin film for drain electrode shown in FIG. 2.

As explained above, according to the super conduction field effect transistor having a bi-crystal boundary junction of the present invention, there exist superior advantages as follows:

1. In the super conduction field effect transistor having a bi-crystal boundary junction shown in FIG. 1, since the elastic stress occurring in the super conductive source and drain electrodes can be avoided, the resulting field effect transistor can be operated at a super conduction transition temperature of above 70 K° by depositing an amorphous insulating layer for gate electrode.

2. In the super conduction field effect transistor having a bi-crystal boundary junction shown in FIG. 2, the occurrence of the elastic stress due to the amorphous insulating layer for gate electrode can be avoided. Further, since the occurrence of the elastic stress due to the difference in the lattice constants between the bi-crystal substrate and the super conductive thin film can also be prevented, the resulting field effect transistor can be operated at a super conduction transition temperature of above 77 K° by depositing the non-super conductive oxide layer having a compound of $PrBa_2Cu_3O_{7-x}$.

What is claimed is:

1. A method for manufacturing a field effect transistor having a bi-crystal boundary junction comprising the steps of:

preparing a bi-crystal substrate;

forming a super conductive thin films for source and drain electrode on said bi-crystal substrate by depositing a super conductive thin film thereon;

forming a boundary channel interposed between said bi-crystal super conductive thin films for source and drain electrode and extended into said bi-crystal substrate;

forming an amorphous insulating layer for gate electrode on a portion between said bi-crystal super conductive thin films for source and drain electrode above the boundary channel by depositing an amorphous insulating layer on the entire surface of the resulting structure and performing a mask patterning process thereof; and forming metal pads for electrode on said bi-crystal super conductive thin films for source and drain electrode and the amorphous insulating layer for gate electrode by depositing a metal layer on the entire surface of the resulting structure and performing a mask patterning process thereof.

2. The method for manufacturing the field effect transistor according to claim 1, wherein said bi-crystal substrate is formed by $SrTiO_3$.

3. The method for manufacturing the field effect transistor according to claim 1, wherein said bi-crystal substrate is formed with an oxide layer having a boundary angle of 24° or 36.8°.

4. The method for manufacturing the field effect transistor according to claim 1, wherein said super conductive thin film is formed by $YBa_2Cu_3O_{7-x}$.

5. The method for manufacturing the field effect transistor according to claim 1, wherein said amorphous insulating layer for gate electrode is formed by $SrTiO_3$.

6. The method for manufacturing the field effect transistor according to claim 1, wherein said super conductive thin film is deposited in a thickness of 10 nm to 100 nm at a substrate temperature of 800° C. to 850° C.

7. The method for manufacturing the field effect transistor according to claim 1, wherein said super conductive thin film is deposited in a thickness of 10 nm to 100 nm having a deposition pressure of 100 mTorr in the presence of Oxygen.

8. The method for manufacturing the field effect transistor according to claim 1, wherein said amorphous insulating layer for gate electrode is deposited in a thickness of 100 nm to 300 nm at a substrate temperature of 25° C. to 100° C.

9. The method for manufacturing the field effect transistor according to claim 1, wherein said amorphous insulating layer for gate electrode is deposited in a thickness of 100 nm to 300 nm having a deposition pressure of 100 mTorr in the presence of Oxygen.

10. The method for manufacturing the field effect transistor according to claim 1, wherein said metal pads for electrode are formed by an Au metal.

11. The method for manufacturing the field effect transistor according to claim 1, wherein said metal pads for electrode are deposited in a thickness of 100 nm to 300 nm at a substrate temperature of 25° C. to 100° C.

12. The method for manufacturing the field effect transistor according to claim 1, wherein said metal pads for electrode are deposited in a thickness of 10 nm to 100 nm having a deposition pressure of 100 mTorr in the presence of Oxygen.

13. A method for manufacturing a field effect transistor having a bi-crystal boundary junction comprising:

preparing a bi-crystal substrate;

depositing a non-super conductive oxide layer on said bi-crystal substrate;

forming a super conductive thin films for source and drain electrode on said non-super conductive oxide layer by depositing a super conductive thin film thereon;

forming a boundary channel interposed between said bi-crystal super conductive thin films for source and drain electrode and extended into said non-super conductive oxide layer and said bi-crystal substrate;

forming an amorphous insulating layer for gate electrode on a portion between said bi-crystal super conductive thin films for source and drain electrode above said boundary channel by depositing an amorphous insulating layer on the entire surface of the resulting structure and performing a mask patterning process thereof; and forming metal pads for electrode on said bi-crystal super conductive thin films for source and drain electrode and the amorphous insulating layer for gate electrode by depositing a metal layer on the entire surface of the resulting structure and performing a mask patterning process thereof.

14. The method for manufacturing the field effect transistor according to claim 13, wherein said bi-crystal substrate is formed by $SrTiO_3$.

15. The method for manufacturing the field effect transistor according to claim 13, wherein said bi-crystal substrate is formed with an oxide having a boundary angle of 24° or 36.8°.

16. The method for manufacturing the field effect transistor according to claim 13, wherein said non-super conductive oxide layer is formed by $PrBa_2Cu_3O_{7-x}$.

17. The method for manufacturing the field effect transistor according to claim 13, wherein said super conductive thin film is formed by $YBa_2Cu_3O_{7-x}$.

18. The method for manufacturing the field effect transistor according to claim 13, wherein said amorphous insulating layer for gate electrode is formed by $SrTiO_3$.

19. The method for manufacturing the field effect transistor according to claim 13, wherein said non-super conductive oxide layer is deposited in a thickness of 10 nm to 100 nm at a substrate temperature of 800° C. to 850° C.

20. The method for manufacturing the field effect transistor according to claim 13, wherein said non-super conductive thin film is deposited in a thickness of 10 nm to 100 nm having a deposition pressure of 100 mTorr in the presence of Oxygen.

21. The method for manufacturing the field effect transistor according to claim 13, wherein said super conductive thin film is deposited in a thickness of 10 nm to 100 nm at a substrate temperature of 800° C. to 850° C.

22. The method for manufacturing the field effect transistor according to claim 13, wherein said super conductive thin film is deposited in a thickness of 10 nm to 100 nm having a deposition pressure of 100 mTorr in the presence of Oxygen.

23. The method for manufacturing the field effect transistor according to claim 13, wherein said amorphous insulating layer for gate electrode is deposited in a thickness of 100 nm to 300 nm at a substrate temperature of 25° C. to 100° C.

24. The method for manufacturing the field effect transistor according to claim 13, wherein said amorphous insulating layer for gate electrode is deposited in a thickness of 100 nm to 300 nm having a deposition pressure of 100 mTorr in the presence of Oxygen.

25. The method for manufacturing the field effect transistor according to claim 13, wherein said metal pads for electrode are formed by an Au metal.

26. The method for manufacturing the field effect transistor according to claim 13, wherein said metal pads for electrode are deposited in a thickness of 100 nm to 300 nm at a substrate temperature of 25° C. to 100° C.

27. The method for manufacturing the field effect transistor according to claim 13, wherein said metal pads for electrode are deposited in a thickness of 10 nm to 100 nm having a deposition pressure of 100 mTorr in the presence of Oxygen.

* * * * *